(12) United States Patent
Miyano et al.

(10) Patent No.: US 6,627,560 B1
(45) Date of Patent: Sep. 30, 2003

(54) METHOD OF MANUFACTURING SEMICONDUCTOR DEVICE

(75) Inventors: Junichi Miyano, Miyazaki (JP); Kiyohiko Toshikawa, Miyazaki (JP); Yoshikazu Motoyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/305,952

(22) Filed: Nov. 29, 2002

(30) Foreign Application Priority Data

May 30, 2002 (JP) ........................................ 2002-157045

(51) Int. Cl.[7] ........................ H01L 21/31; H01L 21/469; H01L 21/26
(52) U.S. Cl. ........................................ 438/788; 438/795
(58) Field of Search ................................ 438/788, 778, 438/787, 795

(56) References Cited

U.S. PATENT DOCUMENTS 5,661,092 A * 8/1997 Koberstein et al. ......... 427/515
5,710,079 A * 1/1998 Sukharev et al. ........... 438/778
5,998,303 A * 12/1999 Sato ........................... 438/758
6,323,297 B1 * 11/2001 Lee et al. .................... 526/251
6,461,692 B2 * 10/2002 Fuji et al. .................... 427/582

FOREIGN PATENT DOCUMENTS

| JP | 2001-156057 | 5/2001 |
| JP | 2001-210638 | 8/2001 |

* cited by examiner

Primary Examiner—Alexander Ghyka
(74) Attorney, Agent, or Firm—Volentine Francos, PLLC

(57) ABSTRACT

A method of manufacturing an interlayer insulating film that can form an insulating layer having excellent planarization property without using an etch-back process is offered. A method of manufacturing a semiconductor device having a step of forming an interlayer insulating film on an object comprises a step of supplying octa-methylcyclotetrasiloxane as a source gas into a vacuum processing chamber of a vacuum ultraviolet CVD apparatus in which an object on which an interlayer insulating film is to be formed is arranged; and a step of irradiating vacuum ultraviolet light from a vacuum ultraviolet light source arranged on an upper part of the vacuum processing chamber onto the object placed in the vacuum processing chamber to grow an interlayer insulating film.

19 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing an interlayer insulating film in processes in manufacturing a semiconductor device.

2. Description of the Related Art

A multilevel wiring structure is known as one of techniques for increasing the degree of integration of a semiconductor device constituted by an assembly of semiconductor elements such as metal oxide film semiconductor field effect transistors (MOSFET) assembled on a semiconductor substrate. When the multilevel wiring structure is realized by a photolithographic etching method, in order to bury vertical steps of semiconductor elements on a semiconductor substrate and insulate wires from each other, a technique for forming an insulation film layer which is good in planarization is considerably important.

A method of forming an insulating layer having a low-pressure CVD (CVD: Chemical Vapor Deposition) on an insulating film formed on a semiconductor substrate is as follows. For example, tetra-ethoxyorthosilicate ($Si(OC_2H_5)_4$: to be simply referred to as TEOS hereinafter) is supplied as a source gas into a reaction chamber of a low-pressure CVD in which a semiconductor substrate on which an insulating layer is to be grown is arranged. At this time, an oxygen gas is supplied as an additive gas together with the source gas. A high-frequency voltage is applied across electrodes to generate plasma and to grow $SiO_2$ layer on the semiconductor substrate. In this manner, preferably formation of an insulating layer is realized.

However, since a plurality of wires are arranged on the semiconductor substrate, when an insulating is grown to form an interlayer insulating film as described above method, the insulating film grown on the semiconductor substrate has an uneven portion due to steps of the wires.

In order to remove the uneven portion, the following etch back is executed. That is, a coating film is formed to bury the uneven portion of the insulating film formed on the semiconductor substrate, and the coating film is entirely etched, so that the insulating film formed on the semiconductor substrate is planarized. However, when this process is executed, the following problems are posed. That is, an interlayer insulating film is not easily formed, the steps in manufacturing a semiconductor device is complicated, and manufacturing costs also increases.

In addition, a film forming temperature of an interlayer insulating film in an ultra-large-scale integrated circuit (ULSI) used at the present is 400° C. However, in the future, with development of micro patterning of a semiconductor device, a channel of a transistor is further narrowed, and a diffusion layer cannot neglect spreading even though the film forming temperature is 400° C.

Furthermore, an organic electro luminescence (to be referred to as an organic EL hereinafter) display, which is considered as a next-generation display with which a liquid crystal display will be replaced, cannot withstand a temperature of more than 100° C. at the present. For this reason, the step of forming a film on the organic EL must be performed at a temperature of 100° C. or less.

SUMMARY OF THE INVENTION

The present invention has been made in consideration of the problems held by a conventional method of manufacturing a semiconductor device, and has as its object to provide a novel and improved method of manufacturing an interlayer insulating film which can manufacture an interlayer insulating film in which recessed portions between wiring grooves formed by causing wires formed on a semiconductor substrate projections to serve as projections are preferably buried with an insulating layer to make it possible to form an insulating layer having excellent planarization property without using an etch-back process.

In order to solve the above problem, according to the viewpoint of the present invention, there is provided a method of manufacturing a semiconductor device including: a step of supplying octa-methylcyclotetrasiloxane as a source gas into a vacuum processing chamber of a vacuum ultraviolet CVD apparatus in which an object on which an interlayer insulating film is to be formed is arranged; and a step of irradiating vacuum ultraviolet light from a vacuum ultraviolet light source arranged on an upper part of the vacuum processing chamber onto the object placed in the vacuum processing chamber to grow an interlayer insulating film.

With this configuration, after a film is formed between wiring grooves at room temperature without using an etch-back process and an oxidizing gas, manufacture of an insulating layer having excellent planarization property and formation of an interlayer insulating film consisting of an SiOCH film having a low dielectric constant are realized.

In addition to the source gas, an inert gas is supplied as an additive gas to regulate the concentration of the source gas, so that the film forming property and film forming rate of the insulating film can be controlled.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawngs which illustrate preferred embodiments.

DETAILED DESCRIPTION OF THE PREFERRED EMBODIMENT

Figure 1:
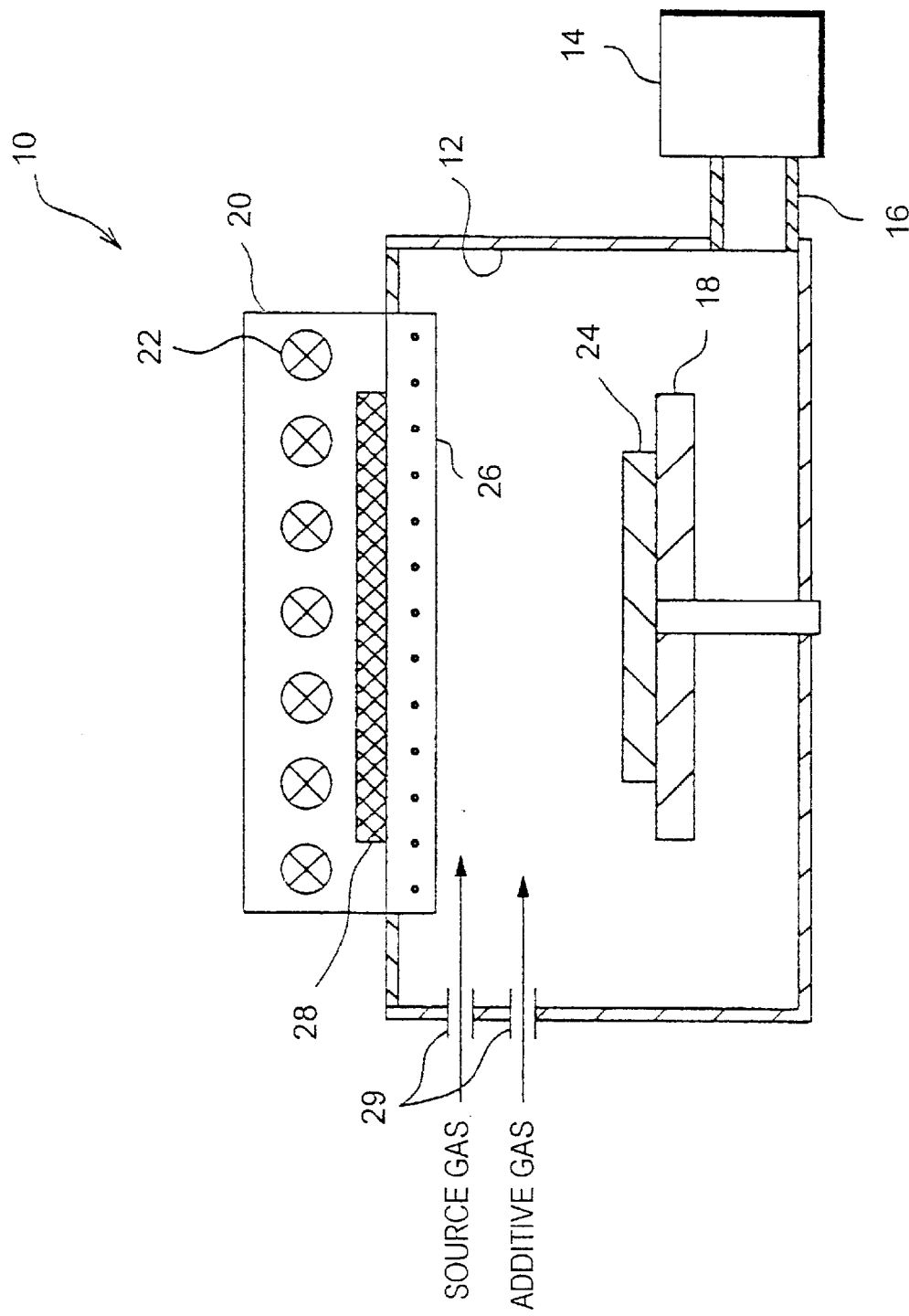
FIG. 1 is a sectional view schematically showing a vacuum ultraviolet CVD apparatus according to the present invention.
Figure 2A:
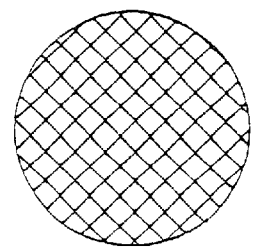
FIGS. 2A, 2B, 2C, and 2D are diagrams showing shapes of heaters arranged in a vacuum ultraviolet CVD apparatus according to the present invention.
Figure 2B:
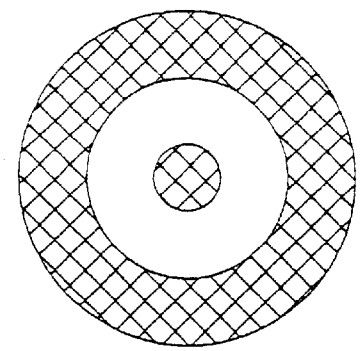
Figure 2C:
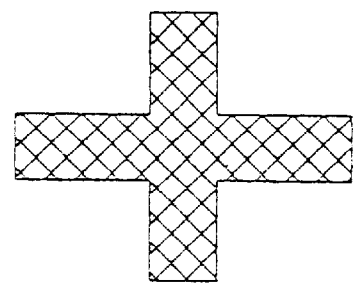
Figure 2D:
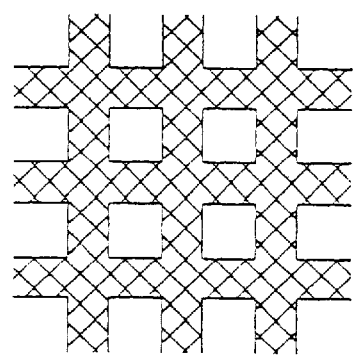

Preferred embodiment of the present invention will be described below with reference to the accompanying drawings. The same reference numerals as in this specification and the drawings denote the constituent elements substantially having the same functions in the specification and the drawings.

FIG. 1 schematically shows a vacuum ultraviolet CVD apparatus for performing an interlayer insulating film-manufacturing method according to the present invention. A vacuum ultraviolet CVD apparatus 10 according to the present invention is used to form an insulating layer of a low-dielectric-constant organic SiOCH film in the steps in manufacturing a semiconductor device such as an MOS transistor.

The vacuum ultraviolet CVD apparatus 10, as shown in FIG. 1, comprises a vacuum-processing chamber 12. In order to maintain a reduced pressure state in the vacuum-processing chamber 12, for example, a negative pressure source 14 constituted by, e.g., a vacuum pump is connected to one end of the vacuum-processing chamber 12 through a pipe 16. A placing table 18 on which an object 24 such as a semiconductor substrate obtained by forming a silicon oxide film is formed as an insulating film on a substrate is placed is arranged in the vacuum-processing chamber 12. In addition, a lamp house 20 comprising a vacuum ultraviolet light source 22 such as an $Xe_2$ excimer-lamp is arranged in the upper part of the vacuum processing chamber 12 through a synthetic quartz window 26 and a heater 28 serving as a heating means for a synthetic quartz window 26.

In this embodiment, a light source that emits ultraviolet light having a wavelength, which is shorter than about 200 nm, i.e., ultraviolet light in a vacuum ultraviolet region is preferably selected as the vacuum ultraviolet light source 22.

The object 24 obtained by forming a silicon oxide film as, e.g., an insulating film on the surface of a semiconductor substrate is placed on the placing table 18 such that the silicon oxide film faces upward. The placing table 18 comprises a temperature regulating function (not shown), the temperature regulation performed by the placing table 18 makes it possible to regulate the temperature of the object 24 within the range of room temperature to 350° C. In this embodiment, since OMCTS serving as a source gas tends to make an insulating film at normal temperature, an interlayer insulating film is formed such that the temperature of the object 24 is set at a room temperature of 100° C.

The lamp house 20 including the vacuum ultraviolet light source 22 therein is arranged in the upper part of the vacuum processing chamber 12 such that the synthetic quartz window 26 serving as an irradiation window to which a synthetic quartz plate is attached is located above the object 24 placed on the placing table 18 provide in the vacuum processing chamber 12. The lamp house 20 irradiates ultraviolet light to the object 24 through the synthetic quartz window 26.

In order to grow an insulating film on the surface of the object 24 on which the silicon oxide film (not shown) is formed, a source gas and an additive gas (if necessary) are fed from a feed pipe 29 arranged on the sidewall of the vacuum processing chamber 12. In the embodiment of the present invention, as the source gas octamethylcyclotetrasiloxane ($[(CH_3)_2SiO]_4$: to be simply referred to as OMCTS hereinafter) is used.

In this embodiment, when vacuum ultraviolet CVD is performed by using OMCTS as a source gas, an interlayer insulating film having excellent planarization property is formed by feeding only single OMCTS. For this reason, unlike a conventional technique, an oxygen ($O_2$) gas need not be fed into the vacuum-processing chamber 12 as an oxidizing gas for a source gas. With this configuration, the oxygen gas need not pass through an ozonizer for feeding an oxygen gas for forming an insulating film.

In order to regulate the concentration of the source gas, depending on the shape of the vacuum processing chamber 12 and an exhausting rate of a pump (not shown), an inert gas such as a nitrogen ($N_2$) gas or an argon (Ar) gas is fed as an additive gas, so that the film forming property and film forming rate of the insulating film can also be controlled.

When the additive gas is fed, and a pressure is set to be equal to a pressure at which no additive gas is fed, a partial pressure of the source gas becomes low, and a film-forming rate becomes low. For this reason, a total pressure in the vacuum-processing chamber 12 is controlled to a relatively high pressure. At this time, trade-off between the uniformity of film thickness and the film-forming rate must be considered.

On the placing table 18, when an interval between the object 24 held at room temperature and the synthetic quartz window 26 arranged under the vacuum ultraviolet light source 22 is held at, e.g., 25 mm, at a illuminance of ultraviolet light which is 30 mW/cm², immediately under the synthetic quartz window 26 20 m in thickness, the object 24 is irradiated by ultraviolet light from the vacuum ultraviolet light source 22. In this environment, OMCTS serving as the source gas is supplied into the vacuum processing chamber 12 at a flow rate of 10 sccm through the feed pipe 29 arranged on the sidewall of the vacuum processing chamber 12. The insulating film that is a low-dielectric-constant organic SiOCH film is formed on the object 24. Under this condition, a reaction pressure in the vacuum-processing chamber 12 is 100 mTorr.

In the vacuum ultraviolet CVD executed in this embodiment, since a threshold value changes depending on the type of an applied source gas, a film can be prevented from being formed on the entire window such that the temperature is kept at a temperature which is equal to or higher than a certain temperature. The OMCTS fed as the source gas in this embodiment has such characteristics that a film is easily formed at a normal temperature and is not easily formed at a high temperature. For this reason, in order to prevent the synthetic quartz window 26 from being clouded by growth of an insulating film on the synthetic quartz window 26, the synthetic quartz window 26 is heated by the heater 28 mounted on the synthetic quartz window 26 to a temperature, e.g., 90° C. which is higher than a threshold temperature of the OMCTS serving as the source gas. By heating the synthetic quartz window, the forming efficiency of the interlayer insulating film can be prevented.

In order to more uniformly form the film thickness of the insulating layer formed on the object 24, the flow of the gas in the vacuum-processing chamber 12 is preferably uniformed. In this embodiment, the lower surface of the top plate of the vacuum processing chamber 12 and the lower surface of the synthetic quartz window 26 are not on the same plane, and have a step. Due to the structure, the source gas concentration becomes high at the center of the synthetic quartz window 26, and a problem that conclusively increases the film thickness may occur. In order to solve this problem, a temperature gradient given by the heaters 28 arranged on the synthetic quartz window 26, and the flow of the gas in the vacuum-processing chamber 12 is made laminar to improve the uniformity of the film thickness.

As shown in FIG. 2, a plurality of shapes are prepared for the heaters 28 arranged on the synthetic quartz window 26 to give a temperature gradient to the heaters 28, so that the flow of the gas in the vacuum processing chamber 12 is made uniform.

The heaters 28 having a circular shape (FIG. 2A), a doughnut shape (FIG. 2B), a cross shape (FIG. 2C), and a lattice shape (FIG. 2D) are arranged on the synthetic quartz window 26. The shapes of the heaters 28 and the number of heaters 28 are made changeable to give a temperature gradient to the heaters 28, so that the flow of the gas in the vacuum-processing chamber 12 can be made uniform. For this reason, the uniformity of the film thickness of the interlayer insulating film formed in the plane of the object can be improved.

In this embodiment, the shape of the vacuum-processing chamber 12 and the size of the synthetic quartz window 26 affect the flow of the gas in the vacuum-processing chamber. For this reason, the heaters 28 having shapes optimum for the vacuum processing chamber 12 and the synthetic quartz window 26 are arranged before the film is not formed, and a temperature gradient is given to the heaters 28, so that the flow of the gas in the vacuum processing chamber 12 is made uniform. In this manner, the uniformity of the film thickness of the interlayer insulating film formed in the plane of the object 24 can be improved.

By a 3-minute operation of the vacuum ultraviolet CVD apparatus 10 under the above conditions, an insulating film mainly containing low-dielectric-constant (3.5 can be obtained at the present) organic SiOCH is grown on the silicon oxide film of the object 24.

Figure 3A:
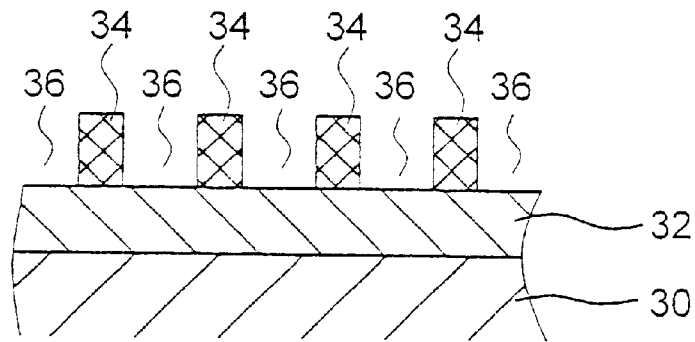
FIGS. 3A, 3B, and 3C are diagrams showing steps in forming an interlayer insulating film according to the present invention.
Figure 3B:
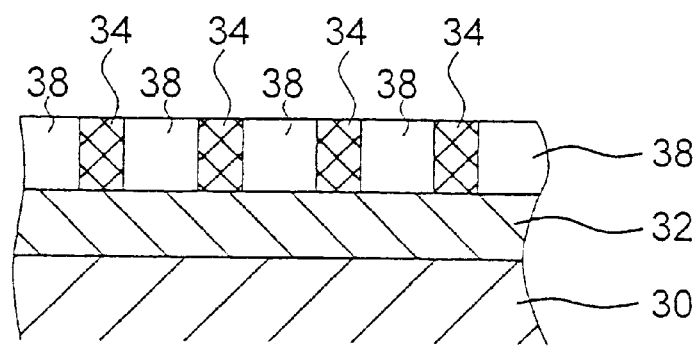
Figure 3C:
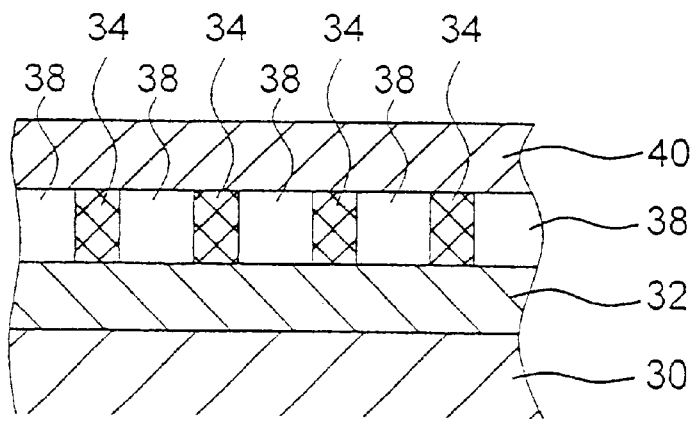

FIGS. 3A, 3B, and 3C are sectional views showing sectional shapes of an interlayer insulating film in manufacturing steps when the method of manufacturing an interlayer insulating film of a semiconductor device according to the present invention is performed.

In the steps in manufacturing a semiconductor such as an MOS transistor, as shown in FIG. 3A, a plurality of wires 34 are formed on a semiconductor substrate 30 through an insulating film 32 constituted by, e.g., a silicon oxide film. A circuit element such as an MOS transistor (not shown) is formed on the semiconductor substrate 30, and, for the circuit element on the semiconductor substrate 30, the wires 34 are formed on the semiconductor substrate 30 through the insulating film 32.

The wires 34 according to the embodiments consist of a metal material such as tungsten or polysilicon films and have wire widths of 0.3 to 0.6 $\mu$m. The wires 34 have such a structure that the wires 34 are parallel to each other at intervals of, e.g., 0.5 $\mu$m in the direction of width.

FIG. 3B is a sectional view of the interlayer insulating film when the interlayer insulating film is formed in this embodiment. The semiconductor substrate 30 on which the wires 34 are formed as described above are arranged on the placing table 18 of the vacuum ultraviolet CVD apparatus 10 shown in FIG. 1 such that the wires 34 face upward, and an insulating layer 38 is grown on the insulating film 32 having the wires 34 under the same growing conditions as described above. As shown in FIG. 3B, the insulating layers 38 mainly containing organic SiOCH can be selectively grown in inter-wire grooves 36 shown in FIG. 3A.

The insulating layers 38 are selectively grown on the insulating film 32 such that the insulating layers 38 are concentrically deposited in the inter-wire grooves 36 serving as recessed portions determined between the wires except for on the wires 34 constituting projection portions on the insulating film 32. The insulating layers 38 formed in this embodiment are grown by growth for about 3 minutes until the top surfaces of the insulating layers 38 reaches the top surfaces of the wires 34 as shown in FIG. 3B.

The insulating layers 38 formed by this embodiment are formed in only the inter-wire grooves 36 as shown in FIG. 3B, are not formed on the wires 34, and achieve considerably high planarization property. For this reason, the wires 34 and the insulating layers 38 for filling the inter-wire grooves 36 can form a planarized surface.

Therefore, after the insulating layers 38 are formed, when no process is performed, the same burying property as that of the shape of the interlayer insulating film when an etch-back process is performed after SOG is coated. For this reason, an etch-back process for obtaining a planarized surface by chemical mechanical polishing (CMP), plasma dry etching process, or the like need not be performed to the insulating layers 38.

For this reason, as shown in FIG. 3C, after the insulating layers 38 is formed in this embodiment, another new insulating layer 40 is deposited, so that the insulating layer 40 having a planarized surface can be formed to cover the wires 34 serving as projection portions and the insulating layers 38 which bury the inter-wire grooves 36. For this reason, after an OMCTS film serving as the insulating layers 38 is formed, a continuous process of forming another insulating film can be performed in the same processing chamber without changing processing chambers.

In order to deposit a new insulating layer 40, another organic material gas such as TEOS is fed into the vacuum-processing chamber 12 under the irradiation of the vacuum ultraviolet light source 22 in the vacuum-processing chamber 12 of the vacuum ultraviolet CVD apparatus 10, so that a planarized insulating layer 40 can be formed.

When another insulating layer 40 is formed by properly using methods such as conventionally well-known plasma enhanced CVD (PECVD), low-pressure CVD (LPCVD), and atmospheric pressure CVD (APCVD), flat insulating layers 38 can also be formed.

According to this embodiment, under the conditions, when the intervals between the projection portions formed by the wires 34 ranged from 0.3 to 0.6 $\mu$m, the insulating layers 38 can preferably and effectively bury the recessed portions 36.

As described above, according to the method of forming an interlayer insulating film according to the present invention, the recessed portions 36 defined in the inter-wire grooves formed by the projection portions constituted by the wires 34 formed on the insulating film 32 of the semiconductor substrate 30 can be appropriately filled with the insulating layers 38. With this configuration, the planarized insulating layers 38 can be grown without using an etch-back process. Therefore, simplification of the steps in manufacturing a semiconductor device, a reduction in production cost, and the like can be realized.

Figure 4:
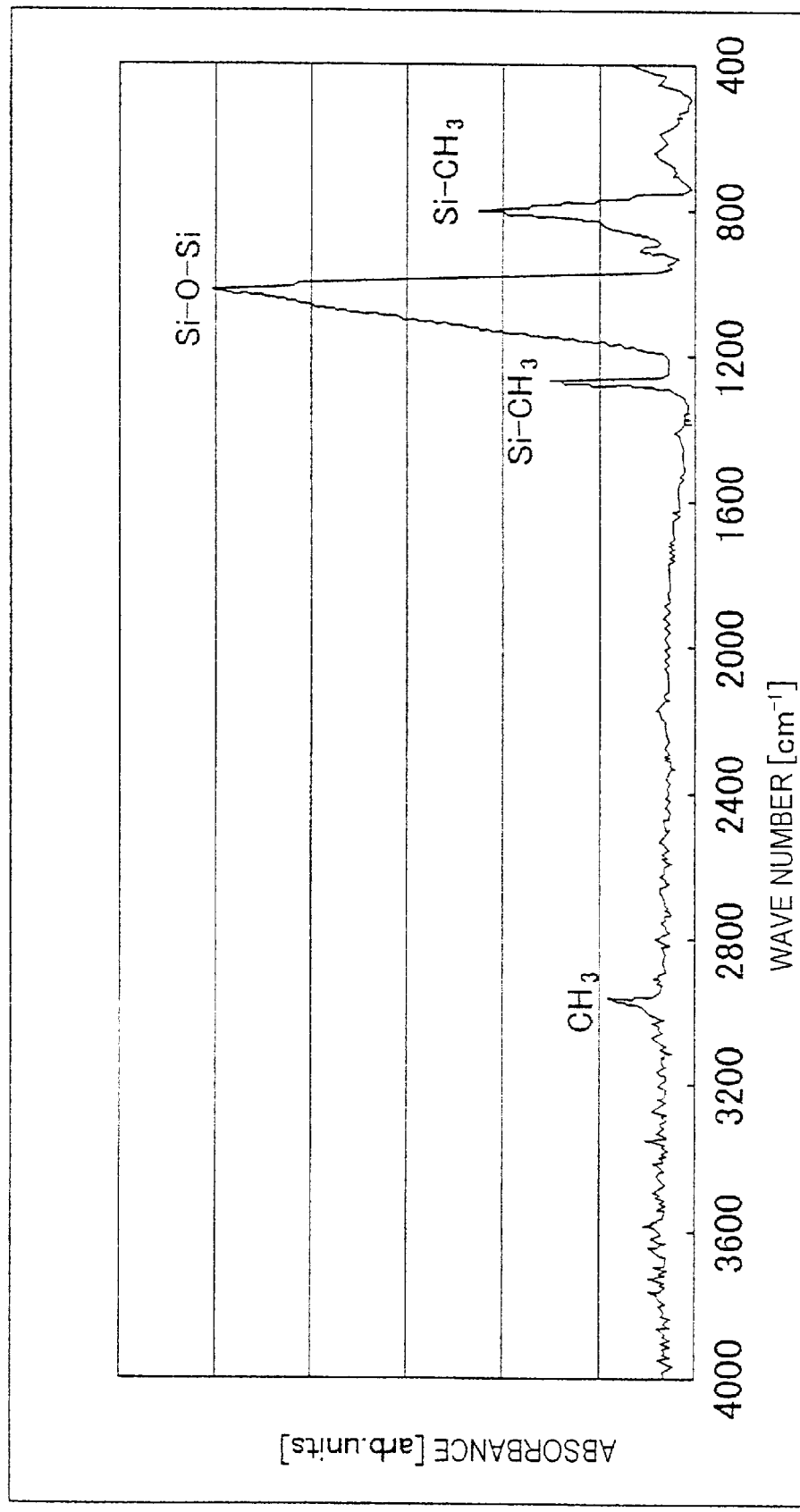
FIG. 4 is a graph showing an analysis result of an interlayer interlayer film according to the present invention by Fourier Transform infrared Spectroscopy (FTIR).

FIG. 4 is a graph showing an analysis result of components of an interlayer insulating film formed in this embodiment by using Fourier Transform Infrared Spectroscopy.

In the Fourier Transform Infrared Spectroscopy, light in an infrared region from a sample is irradiated on an optical interferometer, the intensity of output light is measured as a function of a moving distance of movable mirror, and the intensity of light is Fourier-transformed to obtain spectra. High-sensitive and high-resolution measurement can be performed.

When Fourier Transform Infrared Spectroscopy is used to analyze the components of the interlayer insulating film formed in this embodiment, the wavelength of infrared light irradiated on the sample is continuously shifted, infrared lights having wavelengths depending on materials irradiated with the infrared lights are absorbed at a high absorptance. Therefore, when a wave number at which the absorptance sharply increases, the components of the material irradiated with the infrared lights can be known.

The abscissa of the graph in FIG. 4 represents a reciprocal of the wavelength of infrared light irradiated on the insulating layer serving as a sample, e.g., a wave number ($cm^{-1}$), and the ordinate represents an absorbance (arbitrary unit).

According to the analysis result shown in FIG. 4, as shown in this graph, Si—O—Si indicates the highest peak of the absorbance. Since the sample has a peak similar to the peak of Si—O—based material, it is understood that the interlayer insulating film formed in this embodiment is an oxide film.

Since the peak of the absorbance is also detected in a carbon-based material such as Si—CH$_3$ or CH$_3$ having a low dielectric constant, it is understood that the interlayer insulating film formed in this embodiment is a low-dielectric-constant film containing carbon.

As described above, it is understood that the interlayer insulating film formed in this embodiment is an organic SiOCH film serving as a low dielectric constant. All the materials that exhibit the peak of the absorbance has electric insulating property, and have a low dielectric constant, i.e., a dielectric constant of 3.5 at the present. For this reason, the interlayer insulating film formed in these embodiment excellent electric characteristics such that the interlayer insulating film is a preferable low-dielectric-constant material serving as an interlayer insulating film of a semiconductor device.

In addition, since the insulating layer formed by the method of manufacturing an interlayer insulating film according to the present invention has excellent planarization property, the insulating layer has an advantage in a photolithographic etching technique for an insulating layer, and can be applied to various steps in manufacturing a semiconductor device.

In the method of manufacturing an interlayer insulating film according to the present invention, an insulating layer is formed at room temperature. For this reason, the method can be applied to formation of an interlayer insulating film of a semiconductor device which is patterned so finely that spreading of a diffusion layer cannot be neglected in manufacture of a semiconductor device and a low-temperature process, which will be strongly demanded in the future, such as formation of a film on an organic EL display which is expected as a next-generation display with which a liquid crystal display will be replaced.

The preferable embodiment of the present invention has been described with reference to the accompanying drawings. However, the present invention is not limited to the embodiment. It is apparent that a person skilled in this art can image various changes and modifications without departing from the spirit and scope of the invention. It is understood that these changes and modifications are included in the spirit and scope of the invention as a matter of course.

For example, this embodiment of the present invention has especially described a method of manufacturing an interlayer insulating film of the steps in manufacturing a semiconductor device. However, the present invention can be applied to various steps in manufacturing a semiconductor device such as the step of manufacturing a gate, Damascene interconnects, and electrodes of a memory capacitor.

In addition, the present invention can also be widely applied to an application of element isolation, insulating separation, and the like.

As described above, according to the present invention, when vacuum ultraviolet light is irradiated on an object placed in a processing chamber of a vacuum ultraviolet CVD apparatus, OMCTS is supplied into the processing chamber as a source gas, so that a high-quality insulating layer having a low dielectric constant which is advantageously used as an interlayer insulating film can be formed.

Under the growing conditions, when projection portions are formed on the semiconductor substrate in advance by, e.g., a photo resist material or a conductive material, an insulating layer can be selectively grown in a recessed area which is an area except form the projection portions. For this reason, the method of manufacturing an interlayer insulating film according to the present invention can be applied various steps in manufacturing a semiconductor device such as the steps in manufacturing an interlayer insulating film, a gate, Damascene interconnects, and electrodes of a memory capacitor.

What is claimed is:

1. A method of manufacturing a semiconductor device comprising;
    a step of supplying octa-methylcyclotetrasiloxane into a vacuum processing chamber of a vacuum ultraviolet CVD apparatus in which an object on which an interlayer insulating film is to be formed is arranged; and
    a step of irradiating vacuum ultraviolet light from a vacuum ultraviolet light source arranged on an upper part of the vacuum processing chamber onto the object placed in the vacuum processing chamber to grow the interlayer insulating film.

2. A method of manufacturing a semiconductor device according to claim 1, wherein the vacuum ultraviolet light source is arranged on a synthetic quartz window arranged on the upper part of the vacuum processing chamber through heating means.

3. A method of manufacturing a semiconductor device according to claim 2, further comprising a step of changing a shape of the heating means or a number of heating means depending on a processing state before the step of growing the interlayer insulating film.

4. A method of manufacturing a semiconductor device according to claim 2, further comprising a step of changing the shape of the heating means or the number of heating means depending on a processing state before the step of growing the interlayer insulating film.

5. A method of manufacturing a semiconductor device according to claim 2, wherein the heating means heats the synthetic quartz window to a temperature which is not lower than a threshold temperature of the octa-methylcyclotetrasiloxane.

6. A method of manufacturing a semiconductor device according to claim 2, wherein a heating temperature of the synthetic quartz window set by the heating means is 90° C.

7. A method of manufacturing a semiconductor device according to claim 1, wherein a placing table on which the object is placed has a temperature regulating function.

8. A method of manufacturing a semiconductor device according to claim 7, wherein the temperature of the object is regulated within a range of room temperature to 350° C. by the temperature regulating function.

9. A method of manufacturing a semiconductor device according to claim 1, wherein the interlayer insulating film in the vacuum ultraviolet CVD apparatus is formed such that the temperature of the object is not higher than 100° C.

10. A method of manufacturing a semiconductor device comprising:
    a step of supplying octa-methylcyclotetrasiloxane and an inert gas into a vacuum processing chamber of a vacuum ultraviolet CVD apparatus in which an object on which an interlayer insulating film is to be formed is arranged; and
    a step of irradiating vacuum ultraviolet light from a vacuum ultraviolet light source arranged on an upper part of the vacuum processing chamber onto the object placed in the vacuum processing chamber to grow the interlayer insulating film.

11. A method of manufacturing a semiconductor device according to claim 10, wherein a total pressure in the vacuum processing chamber is regulated depending on a partial pressure of the octa-methylcyclotetrasiloxane.

12. A method of manufacturing a semiconductor device according to claim 10, wherein the vacuum ultraviolet light source is arranged on a synthetic quartz window arranged on an upper part of the vacuum processing chamber through heating means.

13. A method of manufacturing a semiconductor device according to claim 10, further comprising a step of changing a shape of the heating means or a number of heating means depending on a processing state before the step of growing the interlayer insulating film.

14. A method of manufacturing a semiconductor device according to claim 12, further comprising a step of changing the shape of the heating means or the number of heating means depending on the processing state before the step of growing the interlayer insulating film.

15. A method of manufacturing a semiconductor device according to claim 12, wherein the heating means heats the synthetic quartz window to a temperature which is not lower than a threshold temperature of the octa-methylcyclotetrasiloxane.

16. A method of manufacturing a semiconductor device according to claim 12, wherein a heating temperature of the synthetic quartz window set by the heating means is 90° C.

17. A method of manufacturing a semiconductor device according to claim 10, wherein a placing table on which the object is placed has a temperature regulating function.

18. A method of manufacturing a semiconductor device according to claim 17, wherein the temperature of the object is regulated within the range of room temperature to 350° C. by the temperature regulating function.

19. A method of manufacturing a semiconductor device according to claim 10, wherein the interlayer. insulating film in the vacuum ultraviolet CVD apparatus is formed such that the temperature of the object is not higher than 100° C.

* * * * *